United States Patent
Trimberger

(10) Patent No.: US 6,601,227 B1
(45) Date of Patent: Jul. 29, 2003

(54) METHOD FOR MAKING LARGE-SCALE ASIC USING PRE-ENGINEERED LONG DISTANCE ROUTING STRUCTURE

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/894,514

(22) Filed: Jun. 27, 2001

(51) Int. Cl.[7] .............................................. G06F 17/50
(52) U.S. Cl. ......................................... 716/12; 716/13
(58) Field of Search ........................... 716/12, 13, 14; 326/38

(56) References Cited

U.S. PATENT DOCUMENTS 5,406,497 A * 4/1995 Altheimer et al. .......... 364/489
5,974,245 A * 10/1999 Li et al. ................ 395/500.11
6,242,767 B1 * 6/2001 How et al. .................. 257/202

* cited by examiner

*Primary Examiner*—Tuan T. Lam
*Assistant Examiner*—An T. Luu
(74) *Attorney, Agent, or Firm*—Patrick T. Bever; H. C. Chan; Edel M. Young

(57) ABSTRACT

Optimal routing line segments and associated buffers are pre-engineered for each family of ASIC chips by simulating wires segments of various lengths using distributed resistance and capacitance wire models, and by estimating crosstalk from neighboring line segments. During ASIC design, space is reserved on the ASIC substrate for fabricating the buffers, which are selectively connected by local metal and diffusion structures to form long distance interconnections. Signals are passed from an ASIC circuit structure to a selected long distance interconnection by connecting an output terminal of the ASIC structure either to the input terminal of a buffer located at one end of the interconnection, or by connecting the output terminal directed to a line segment of the interconnection.

24 Claims, 5 Drawing Sheets

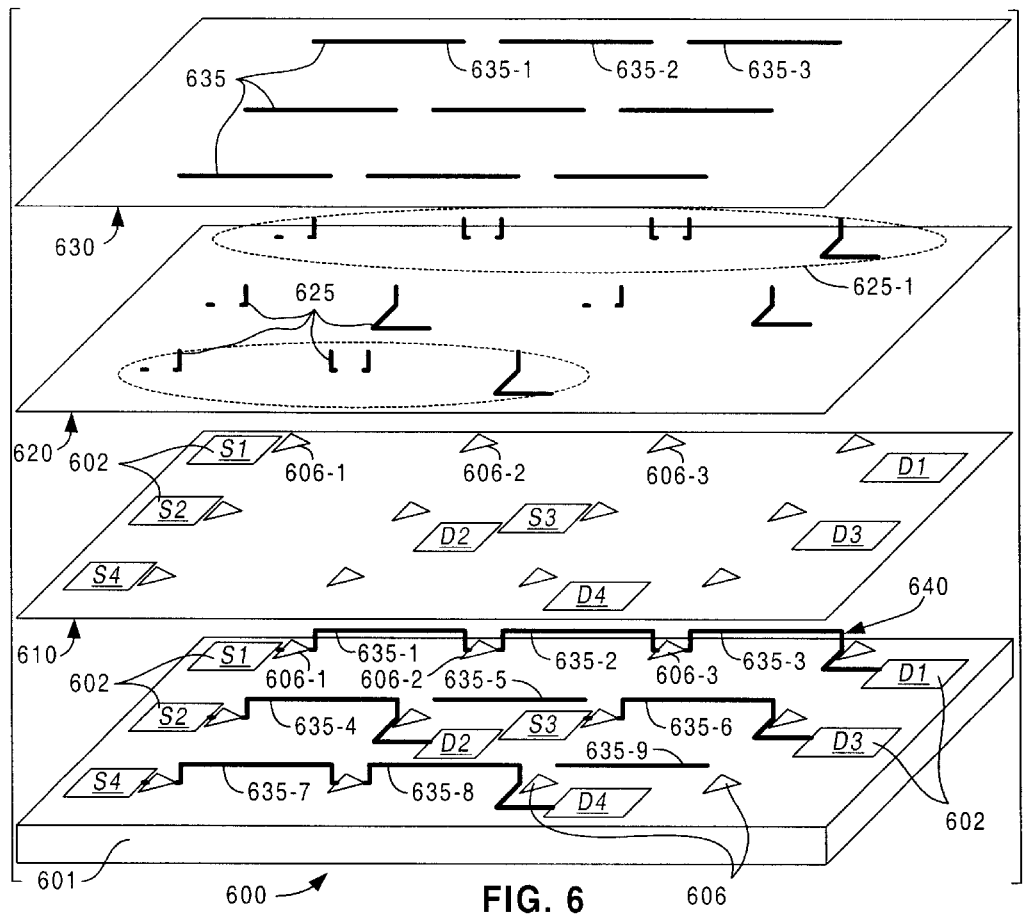
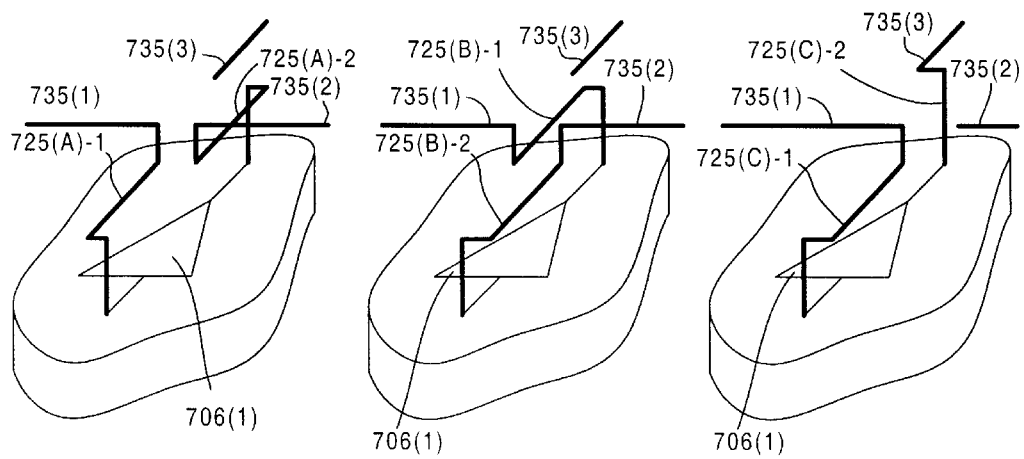
FIG. 7(A)  FIG. 7(B)  FIG. 7(C)

METHOD FOR MAKING LARGE-SCALE ASIC USING PRE-ENGINEERED LONG DISTANCE ROUTING STRUCTURE

FIELD OF THE INVENTION

The present invention is directed to methods and software tools for producing Application-Specific Integrated Circuits (ASICs).

BACKGROUND OF THE INVENTION

ASICs and Programmable Logic Devices (PLDs) represent two distinct types of Integrated Circuits (ICs) that perform specific logic operations. ASICs are distinguished from PLDs in that ASICs are customized during the design and fabrication process to implement a user's logic function, while PLDs are provided with programmable circuitry that is configured (programmed) by a user after the PLD is fabricated.

FIG. 1 is a flow diagram illustrating a simplified conventional process for designing and fabricating an ASIC 100. At the beginning of the design phase, a circuit designer typically selects an ASIC family that is defined, for example, by the feature and chip size of the completed ASIC, along with any pre-defined arrangements of transistors and/or contact pads. The user then enters a logic design into a computer or workstation 110 using an input device 111. Computer 110 is loaded with a logic design entry software tool 113 that is typically linked to a design library 115 containing design parameters associated with the selected ASIC family. Design library 115 also typically includes one or more pre-defined logic elements (often referred to as "macros") that can be selected by the user during the logic design entry process. The user utilizes entry tool 113 to link these pre-defined logic elements with custom-designed logic elements (if any) to construct the logic design. Once the logic design is entered, place and route tools 117, also loaded on computer 110, are utilized to generate a place-and-route solution, which arranges the various interrelated portions of the logic design in an efficient two-dimensional spatial relationship that can be fabricated on a chip, and generates signal (interconnect) lines for passing signals between the interrelated portions. A layout tool 119 is then utilized to construct a three-dimensional representation of the actual circuit structures (e.g., regions of doped semiconductor, insulated regions, and metal lines) needed to implement the logic design. Next, this three-dimensional representation is then used to generate a set of masks (step 120) that are then used to fabricate ASIC 100 (step 130) using known techniques.

Two popular techniques for building ASICs are Mask-Programmed Gate Arrays (MPGAs), Standard Cell or Cell Based Integrated Circuits (CBICs).

FIG. 2 is a perspective view showing a simplified MPGA 200, along with a mask set 210 used during the fabrication phase used to form MPGA 200. MPGA 200 includes rows of pre-defined transistors 202 and surrounding bonding pads 205 that are laid-out independent of the design to be manufactured. Specifically, mask set 210 includes a first group of pre-defined masks 212 that are utilized during the fabrication of all ASICs "built"on MPGA 200. Note that during the ASIC design phase (described above), the placement process assigns portions of the logic function to selected pre-defined transistors 202. An ASIC is "built" on pre-defined transistors 202 using custom mask set 214 that produces interconnect wiring 206 between the assigned transistors 202 to perform the logic functions of the ASIC logic design. Because the layout of transistors 202 is the same for all designs, mask set 212 (i.e., the masks used to fabricate transistors 202) can be shared among all ASIC designs of a particular MPGA family, thereby reducing the costs and shortening the time needed to implement ASIC logic designs by reducing the number of custom masks. Further, the production of custom masks is facilitated using wiring patterns stored in design library 115 (see FIG. 1) that are provided for producing often-used circuit structures, such as logic gates. Typically, design library 115 provides lower level metal layer patterns that wire together predefined sets of transistors to build logic gates. The logic gates are interconnected by longer wires 206 using upper level metal layers to build the ASIC logic design. These upper level metal layers are defined by place and route tools 117. The use of such a design library further reduces the costs and shortens the time needed to implement ASIC designs by automating much of the custom mask design process.

In contrast to MPGAs, CBICs are essentially blank silicon substrates upon which both transistors and wiring connections are custom-made for each design. Similar to MPGAs, certain commonly-used structures (e.g., the transistors and wiring connections of logic gates) are selected from a design "library", and are selectively arranged in custom cells according to a desired ASIC logic design. Because even the transistors are customized in CBICs, designs can be much more complex, and include dense memory and custom data path structures, at the cost of more mask-making and the need to develop custom cells for the logic gates.

Modern IC processes have reduced the size of transistors such that hundreds of millions of transistors to be inexpensively fabricated on a single MPGA or CBIC chip. However, as the numbers of transistors on each chip increase, noise in the interconnect wiring connecting these transistors is becoming an increasing problem. In particular, as IC manufacturing processes improve, signal delay, particularly for "long distance" signals (i.e., signals transmitted between distinct groups of transistors), is dominated by the signal delay caused by transmission through the interconnect wiring. Further, as interconnect wiring gets narrower and thinner with advanced processes, its resistance increases, thereby further delaying the transmission of signals over longer interconnect wires.

One method to address signal delays in long interconnect wires is to segment each interconnect wire into collinear wire segments that are connected in series by buffers. That is, an interconnect wire that spans a long distance in an ASIC design may produce a greater signal delay than a buffered series of wire segments that are optimized to reduce signal delays. The optimal wire segment length (i.e., spacing between buffers) of these buffered signal paths depends primarily on the process technology (i.e., the resistance and capacitance the wire). As process technology advances, the correct fixed length gets smaller and smaller. Further, the sizing of the wire segment and the positions of the buffers depend on nearby wire segments. Therefore, the optimal wire segment and associated buffer size will be different for each family of ASICs that are defined by these features.

A problem with incorporating buffered interconnect wires into a conventional ASIC design processes is the difficult task of automatically breaking the longer wires into optimal-length wire segments, and providing necessary silicon space for the buffers. According to conventional ASIC design processes, the tasks of designing the segmented interconnect wires and placing buffer structures are performed by conventional placement and routing tools, mentioned above, which are highly-sophisticated software programs. Modification of these software programs to break all wires into optimal-length wire segments and to provide buffer space is impractical because the calculations are too difficult to perform quickly during placement and routing. Further, routing must be done after placement, but buffer insertion requires that they be placed, so if buffers are inserted during routing, the placement must change, potentially requiring the route to be re-done also. As a result, it is difficult to predict the actual delay of signals transmitted between circuit groups in an ASIC design prior to routing. This prediction is needed in placement and synthesis to meet timing requirements for the ASIC design.

What is needed is a method and structure that facilitates predictable and optimal-speed interconnect wiring for long distance signal transmissions in ASIC designs. Preferably this method and structure would permit sharing of masks to reduce costs, yet allow custom transistors for dense memory blocks.

SUMMARY OF THE INVENTION

The present invention is directed to a method for making ASICs that utilizes pre-engineered routing structures for implementing long-distance signal connections. The pre-engineered routing structures include sets of optimal-length collinear interconnect wire segments and optimal-size inter-linking buffers that minimize the signal delay associated with long distance signal transmissions in each family of ASIC chips. Note that short-distance connections of the ASIC design, which do not require buffering, are implemented using conventional interconnect wiring. The pre-engineered routing structures are implemented during the place-and-route phase of ASIC design by providing necessary connections to source and destination logic elements of the ASIC. Because the interconnect wire segments are pre-defined, the masks used to make the wiring segments can be pre-made, sharing the mask-making costs for all ASIC designs utilizing a particular ASIC family.

In accordance with an aspect of the present invention, the optimal length of each interconnect wire segment is calculated for each ASIC family by simulating wire segments of various lengths using distributed resistance and capacitance wire models, and estimating crosstalk from neighboring wires. Similarly, the size of each buffer is designed to optimize the speed of signal transmission on each optimal-length wire segment. Because the routing structures are pre-engineered in advance for each family of ASIC chips, rather than once for every logic design to be implemented by the ASIC (or once for each trial route of a signal), signal delays can be calculated during the ASIC design process, thereby greatly simplifying the ASIC design process.

In accordance with another aspect of the present invention, a design library is provided for a family of ASICs that includes the pre-engineered routing structures. One or more upper metal layers of the ASIC production process are reserved in the library for implementing the optimal-length wire segment, and lower metal layers are utilized to facilitate short-distance signal transmissions and connections between adjacent pairs of collinear wire segments (i.e., by connecting to associated interlinking buffers). In one embodiment, a first metal layer is utilized to produce a first set of wiring segments extending in a first direction, and a second metal layer is utilized to produce a second set of wiring segments extending perpendicular to the first set. Space is reserved on the underlying substrate for the buffers of the pre-engineered routing structure. For efficiency, the buffers are arranged so that they can be connected to drive signals in either direction (e.g., from a first segment to a second segment, or from the second segment to the first segment). Adjacent pairs of collinear wire segments are linked or remain separated in the ASIC design by including or omitting corresponding local connections from the lower metal layers. Accordingly, interconnect wires of varying lengths are selectively included in an ASIC design, with each long-distance interconnection being formed by linking two or more optimal-length wire segments. Because the segmentation and buffer sizing are pre-engineered to pass signals in minimum time, all long-distance signal transmissions will reach their destination with a minimum delay possible (except for some additional loading from parts of the first and last segments that extend past the source and destination).

In accordance with yet another aspect of the present invention, source and destination circuits associated with a long-distance signal transmission are placed such that the input terminal of an interconnect buffer is used as a driver for the source of the signal. Selectively positioning the source circuit is made possible because the lower level metal interconnect and transistor layers are customized for each ASIC design.

In accordance with yet another aspect of the present invention, signal branching (i.e., fan-in or fan-out) is accomplished by several methods. First, where a wire branches to two destinations, this branch can be limited to the intersection of the segments, with both downstream branch segments being driven by the same buffer. Alternatively, local interconnection can be provided to link the upstream wire segment to two buffers, each driving one of the downstream branches. In this alternative embodiment, signals may be routed from the end of a long-distance segment, through short-distance routing into the buffer for the following long-distance segment. In yet another embodiment, wires are not permitted to branch—each wire from a source to a destination must have its own wiring path. This is very inefficient in area, particularly for high fan-out signals, but provides good wire delay estimation. In another embodiment, connections may tap off long-distance wires directly, though this introduces delays into the tapped wire segment. Alternatively, connections may be buffered off the long-distance interconnect to preserve the optimal-delay property of long-distance interconnect.

BRIEF DESCRIPTION OF THE DRAWINGS

These and other features, aspects and advantages of the present invention will become better understood with regard to the following description, appended claims, and accompanying drawings, where:

FIG. 6 is an exploded perspective view showing a second simplified ASIC formed in accordance with an aspect of the present invention;

FIGS. 7(A), 7(B) and 7(C) are simplified perspective views showing alternative connections between wire segments and buffers of a pre-engineered routing structure according to the present invention;

DETAILED DESCRIPTION OF THE DRAWINGS

Figure 3:
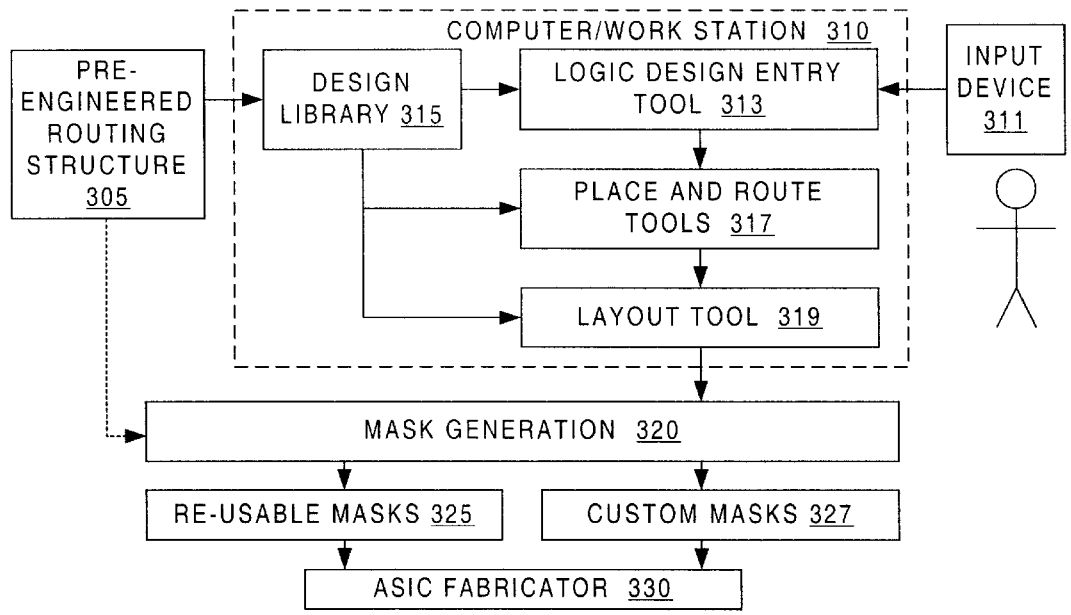
FIG. 3 is a flow diagram illustrating a process for designing and fabricating an ASIC according to the present invention.

FIG. 3 is a diagram illustrating a simplified process for designing and fabricating ASICs using a pre-engineered routing structure 305 that greatly simplifies the ASIC design process by providing an optimal set of wire segments and buffers for transmitting long-distance signals. According to the present invention and as described in detail below, pre-engineered routing structure 305 includes sets of collinear wire segments and associated interlinking buffers that are optimized for long distance signal transmissions in each family of ASIC chips. An optimal routing structure is determined for each family of ASICs by analyzing the particular parameters associated with that ASIC family (e.g., chip size, minimum fabrication feature size, etc.), and determining an optimal wire segment length and buffer size that are optimal for that ASIC family. In one embodiment, the optimal length of each segment is calculated by simulating wire segments of various lengths using distributed resistance and capacitance wire models, and estimating crosstalk from neighboring wires using known analysis methods. Once an optimal wire segment length is determined, the size of each interlinking buffer is then designed to optimize the speed of signal transmission on that wire segment. The resulting pre-engineered routing structure is arranged in a predetermined layout pattern of line segments with interlinking buffers. Specifically, the wire segments are arranged in parallel collinear lines that are assigned to specific regions of one or more metal layers used in the fabrication process of the ASIC family. Similarly, the interlinking buffers are assigned space on the substrate surface that facilitates convenient connection of associated wire segments.

Figure 1:
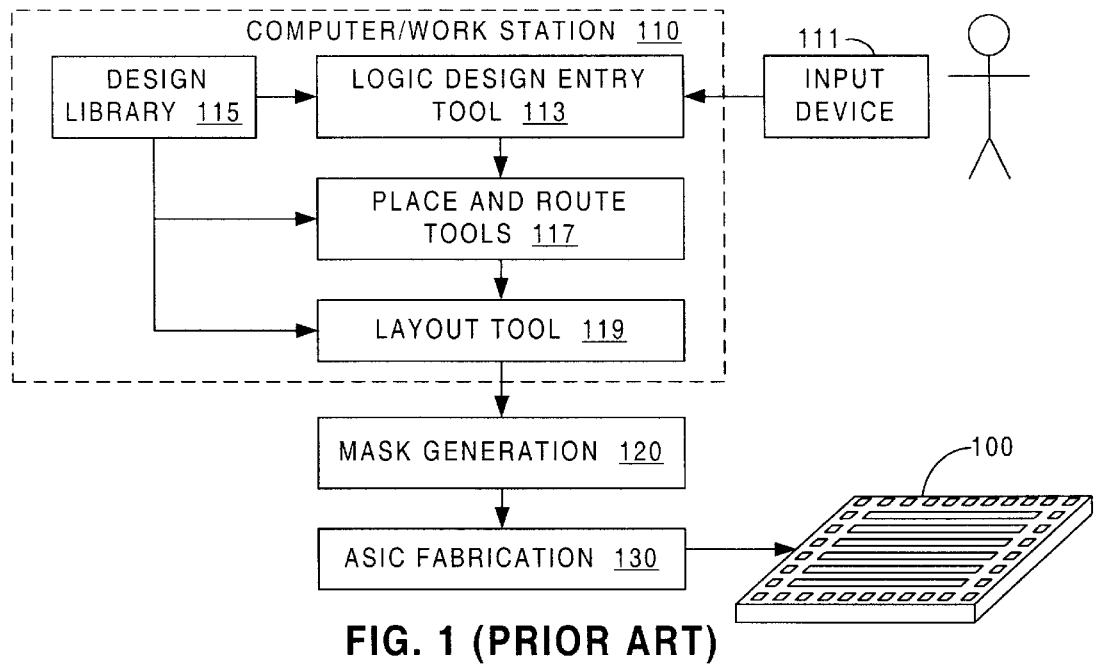
FIG. 1 is a flow diagram illustrating a simplified conventional process for designing and fabricating an ASIC.
Figure 2:
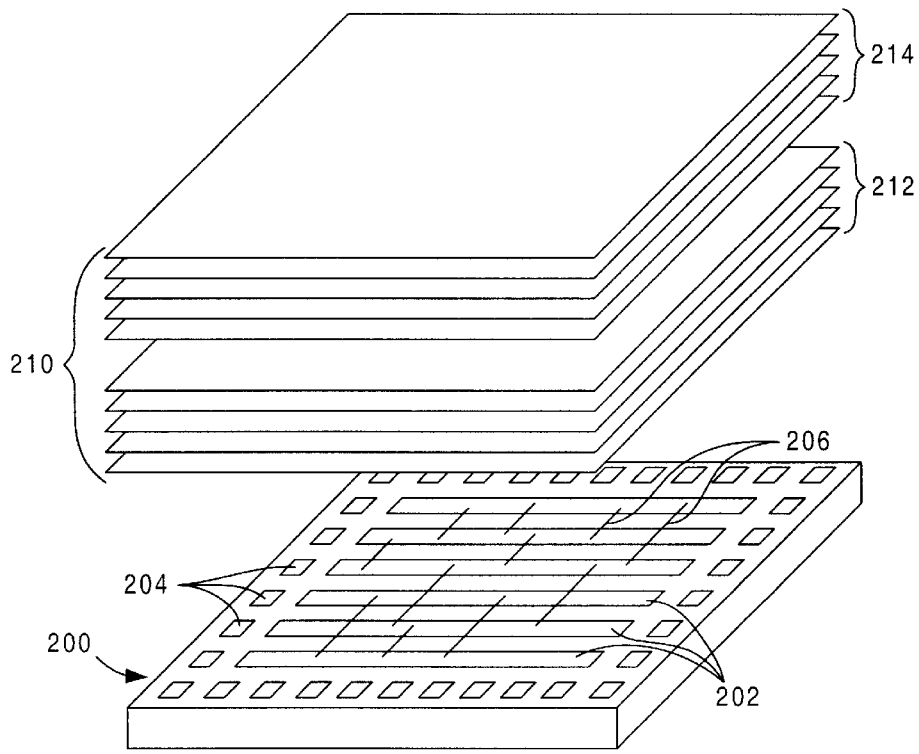
FIG. 2 is a perspective view showing a simplified ASIC along with a mask set used during the fabrication of the ASIC.

After being generated for a family of ASICs, pre-engineered routing structure 305 is stored in the memory of a computer or workstation 310 (e.g., in a design library for use during the subsequent development of an ASIC logic design. Similar to the conventional process (described above with reference to FIG. 1), when a user elects to produce an ASIC using the ASIC family associated with pre-engineered routing structure 305, the user enters an ASIC design into computer 310 using an input device 311, and with the aid of logic design entry tool 313. Logic design entry tool 313 includes information regarding the ASIC family that facilitates the formation of a valid ASIC solution (i.e., the formation of an ASIC design that is implemented using features associated with the selected ASIC family). Once the logic design is entered, place and route tools 317, also loaded on computer 310, are utilized to generate a place and route solution, which arranges the various interrelated portions of the logic design in an efficient pattern that can be fabricated on a chip, and generates signal (interconnect) paths for passing signals between the interrelated portions. Place and route software tools are well known. A layout tool 319 is then utilized to construct a layout solution (i.e., a three-dimensional representation) of the ASIC logic design that is utilized during the subsequent production of fabrication masks according to known techniques.

Figure 4:
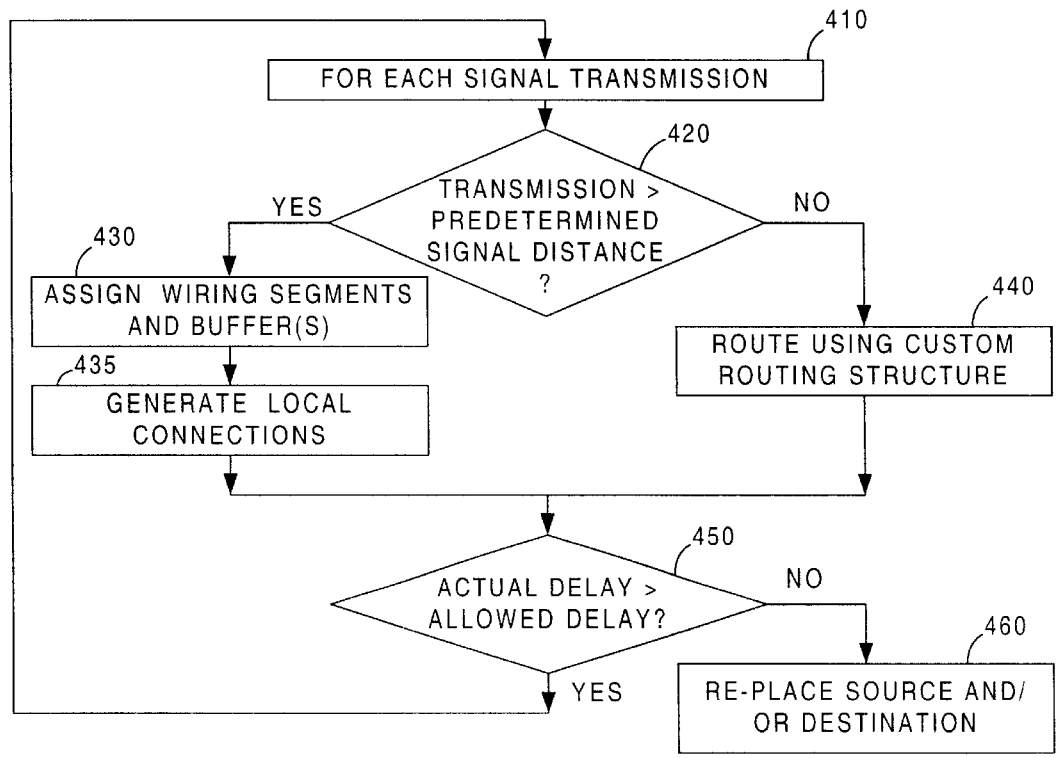
FIG. 4 is a flow diagram illustrating a portion of the process shown in FIG. 3.

FIG. 4 is a flow diagram showing a simplified place and route process performed by place and route tool 317. In accordance with another aspect of the present invention, the place and route process is restricted such that all long distance signal transmissions are routed using pre-engineered routing structure 305. In particular, each signal transmission requiring routing resources is identified (Step 410) and compared with a predetermined signal distance (Step 420). The predetermined signal distance is determined during the generation of pre-engineered routing structure 305, and represents the maximum distance that a signal can be optimally transmitted without buffering. When the signal transmission is greater than the predetermined signal distance (YES in Step 420), then the signal transmission is designated as a long-distance signal transmission, and one or more wire segments and interconnect buffers of pre-engineered routing structure 305 are assigned (Step 430). In one embodiment of the present invention, which is discussed in additional detail below, place and route tool 317 (FIG. 3) then generates local connections between the assigned segments and interconnect buffers and the signal source and destination, which are customized for each ASIC logic design (Step 435). Note that when a signal transmission is shorter than the predetermined signal distance (NO in Step 420), then the signal transmission is designated as a short-distance signal transmission, and the place and route tool 317 generates signal connections using local (custom generated) connections according to known routing techniques (Step 440). The process of identifying long-distance and short-distance signal transmissions, and routing these signal transmissions according to the process described above, is repeated for all signal transmissions associated with the ASIC logic design.

According to another aspect of the present invention, because routing structure 305 is pre-engineered in advance for each family of ASIC chips, rather than once for every logic design to be implemented by the ASIC (or once for each trial route of a signal), signal delays can be calculated during the ASIC design process, thereby greatly simplifying the ASIC production process. For example, as shown in the lower portion of FIG. 4, the signal delay associated with each long-distance signal transmission can be calculated and compared with a user-defined allowable delay (Step 450), and the place and route process can be re-executed to find new placement locations for the source and destination circuits associated with the long-distance signal (Step 460) to achieve an acceptable routing solution. In other embodiments, delay calculation can be performed between placing and routing the long-distance signal transmissions.

Returning to FIG. 3, the layout solution generated by layout tool 319 includes both pre-engineered routing structure 305 and custom wiring needed to implement the ASIC logic design. In one embodiment, the optimal-length wire segments of pre-engineered routing structure 305 are provided in the upper metal layers of the ASIC fabrication process, and customized local connections are implemented in the lower metal layers. As discussed in additional detail below, because the length and orientation of each optimal-length wire segment in routing structure 305 is pre-defined, reusable masks 325 can be produced by a mask generation source (a "mask house") 320 directly from the data describing pre-engineered routing structure 305. These re-usable masks 325 can be pre-made (i.e., before the layout for a specific ASIC logic design is completed), thereby sharing the mask-making costs with all logic designs built on that ASIC family. On the other hand, custom masks 327 are generated for each specific ASIC logic design based on the layout solution generated for that ASIC logic design. Subsequently, both re-usable masks 325 and custom masks 327 are utilized by an ASIC fabrication facility (330) to fabricate an ASIC chip implementing the ASIC logic design according to known techniques.

Figure 5:
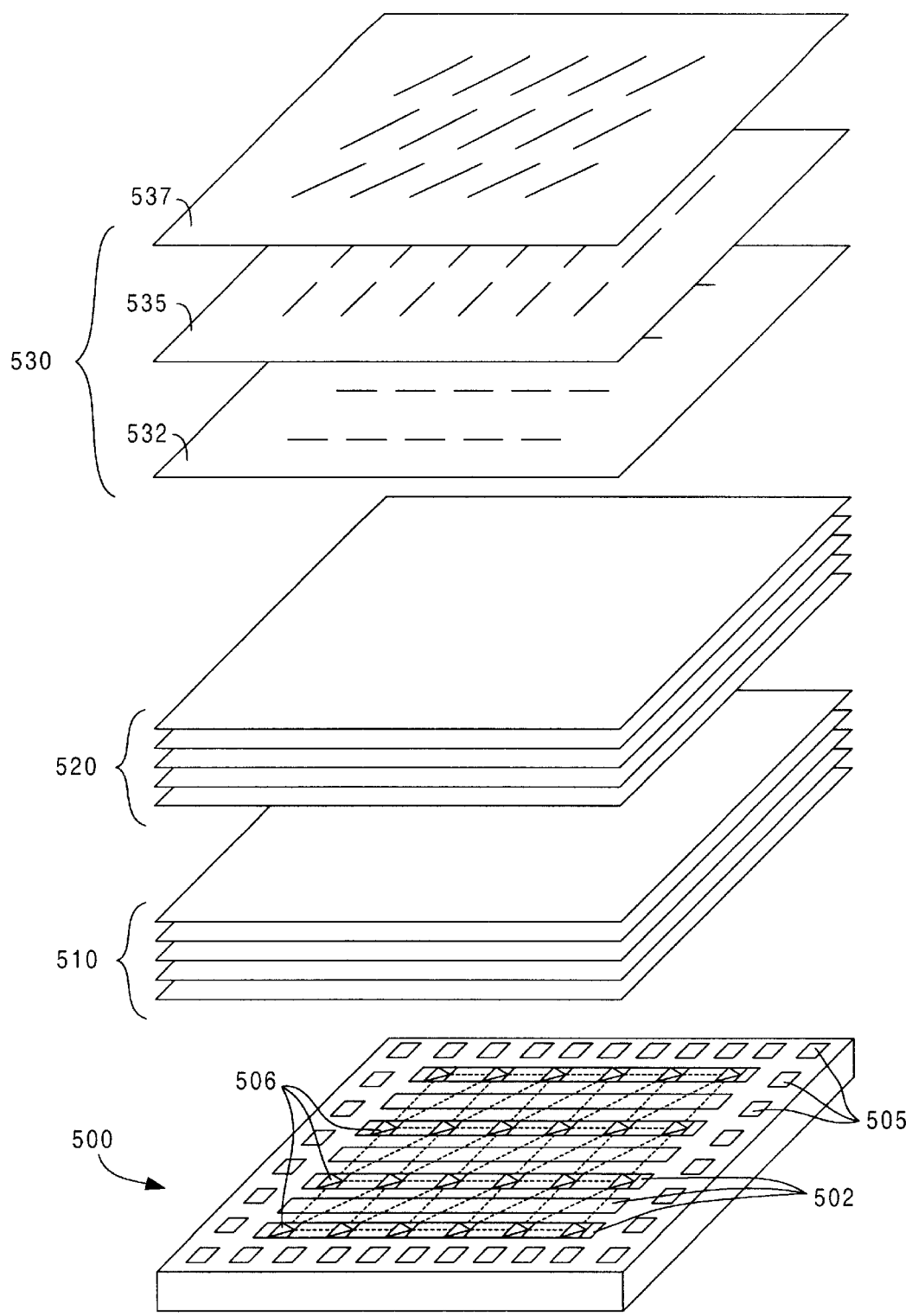
FIG. 5 is a perspective view showing a simplified ASIC formed in accordance with an embodiment of the present invention along with a mask set used during the fabrication of the ASIC.

FIG. 5 is a perspective view showing a simplified ASIC 500, along with a series of mask sets that are used to fabricate ASIC 500 in accordance with the present invention.

Referring to the lower portion of FIG. 5, according to one embodiment of the present invention ASIC 500 is an MPGA-type ASIC including rows of pre-defined transistors 502 and bonding pads 505 surrounding transistor rows 502. Similar to conventional MPGAs, transistor rows 502 and buffer circuits 506 are laid-out independent of the design to be manufactured, and are produced using re-usable pre-defined first mask set 510. Because buffers 506 take up transistor space, the space for building buffers 506 must be reserved (i.e., the buffer space cannot be used by the ASIC placement and routing tools to implement other logic). Reserving buffer space can be accomplished most easily by simply pre-allocating buffer spaces whether or not they are used. This is inefficient in terms of ASIC chip area, but in modern IC processes, such a potential loss of area is reasonable in view of the routing benefits provided by the pre-engineered routing structure of the present invention. Alternatively, the pre-allocated buffer spaces can be assigned during placement, since it is during the placement process that long distance signal transmissions are identified. Note that a pattern of buffers 506 is either incorporated into transistor rows 502 or produced independently to provide buffers for the pre-engineered routing structure of the present invention. In an alternative embodiment, a CBIC-type ASIC may utilize a custom mask set in place of first mask set 510, but the locations of buffers 506 are reserved to prevent assigning these spaces to logic portions of the ASIC logic design.

An intermediate mask set 520 is utilized to provide local connections used to form logic gates from transistor rows 502, and also to provide short-distance wires and connections between logic portions and the pre-engineered routing structure. As discussed above, during the ASIC design phase, the placement process assigns portions of the logic function to selected pre-defined transistors 502. Accordingly, ASIC 500 is "built" on pre-defined transistors 502 using intermediate mask set 520 that produces connections between associated transistors to produce these logic gates, and also provides relatively short wires for transmitting the short-distance signal transmissions identified in Step 440 of FIG. 4 (discussed above). In addition, intermediate mask set 520 is used to produce local connections for the pre-engineered routing structure, as discussed below.

According to an embodiment of the present invention, a re-usable, pre-made third mask set 530 is utilized to generate wire segments of the pre-engineered routing structure (indicated as dashed lines on ASIC 500). In the disclosed embodiment, third mask set 530 includes a first mask 532 for forming a first set of wiring segments oriented in a first direction, a second mask 535 for forming a second set of wiring segments oriented in a second direction that is perpendicular to the first direction, and a third mask 537 for forming a third set of wiring segments oriented in a diagonal direction relative to the first and second directions. The wire segments produced by masks 532, 535, and 537 are typically formed in separate wiring layers that are reserved for forming these wire segment sets. However, modern IC fabrication processes provide six or more metal layers, so plenty of wire remains for the short wires generated by second mask set 520 (discussed above). Note that not all of three wiring layers may be needed for a given ASIC design because only a relatively small fraction of wires in a typical ASIC design need to travel long distances. Therefore, one or more of masks 532, 535, and 537 may be omitted and the metal layers associated with the omitted metal masks be used for short distance wiring.

FIG. 6 is an exploded perspective view showing a simplified ASIC 600 that is fabricated according to the process described above. Shown above ASIC 600 are three planes: a lower plane 610 indicating circuit elements formed on a substrate 601, an intermediate plane 620 including local interconnections, and an upper plane 630 including optimal-length collinear interconnect wire segments 635 formed in accordance with the present invention. The structures in these three planes are examples of the structures produces by mask sets 510, 520, and 530 shown in FIG. 5.

Lower plane 610 includes logic circuits 602 (i.e., source circuits S1-S4 and destination circuits D1–D4) that are designed and placed during the ASIC development process, and pre-defined circuits such as buffer circuits 606, which are assigned reserved spaces on substrate 601. In MPGA-type ASICS, logic circuits 602 may be formed from selected groups of pre-defined transistors that are wired together using low-level metal connections. In CBIC-type ASICs, logic circuits 602 may be custom generated. In accordance with the present invention, in either MPGA-type or CBIC-type ASIC designs, space is reserved at predefined locations on substrate 601 for buffers 606 (i.e., such that logic circuits 602 cannot be placed in these reserved spaces).

Intermediate plane 620 and upper plane 630 respectively include custom short-distance wiring 625 and wire segments 635. Custom wiring 625 is generated during ASIC design and implemented using custom masks to provide local connections between selected circuits of lower plane 610 and selected wire segments 635 of upper plane 630. In accordance with another aspect of the present invention, adjacent pairs of collinear wire segments 635 are linked or remain separated in the ASIC design by including or omitting corresponding custom connections 625 from the metal layers associated with intermediate plane 620 (i.e., the metal layers below that reserved for wire segments 635). Accordingly, signal paths of varying lengths are selectively included in ASIC 600, with each long-distance interconnection being formed by linking two or more wire segments 635 using custom connections 625. For example, a relatively long signal path 640 is provided between a first source S1 and a first destination D1 by linking together wire segments 635-1, 635-2, and 635-3 and buffers 606-1, 606-2, and 606-3 using custom connection group 625-1, which is shown in second plane 620. Similarly, wire segments 635-4 through 635-9 can be selectively linked to generate signal paths of any size (e.g., single segment signal paths 650 and 660, and two-segment signal path 670).

Note that because wire segments 635 are fabricated using re-usable masks, the same number of wire segments 635 is produced for all ASICs in the ASIC family that includes ASIC 600. For example, even though they are not used to transmit signals, wire segments 635-5 and 635-9 are fabricated over substrate 601 along with the remaining wire segments of the pre-engineered routing structure. In another ASIC of the same ASIC family (not shown), these wire segments may be utilized to form signal paths.

FIGS. 7(A) and 7(B) are simplified perspective views showing a first wire segment 735(1), a second wire segment 735(2), a third wire segment 735(3), and an interlinking buffer 706(1). Note that first wire segment 735(1) and second wire segment 735(2) are formed in a first plane (metal layer), and third wire segment 735(3) is formed in a second plane (metal layer) located above the first plane. In accordance with another aspect of the present invention, each buffer of the pre-engineered routing structure is arranged such that it can be connected to drive signals in either direction (e.g., from first segment 735(1) to second segment 735(2), or from second segment 725(2) to first segment 735(1)). This option routing process requires identifying the source segment and destination segment of the signal transmission during the ASIC design process, and the required connections are implemented using local (i.e., custom) routing that is performed during the design process. For example, as shown in FIG. 7(A), local routing structures 725(A)-1 and 725(A)-2 are respectively utilized to route signals from first segment 735(1) to an input terminal of buffer 706(1), and from an output buffer 706(1) to second wire segment 735(2). Conversely, as shown in FIG. 7(B), local routing structure 725(B)-1 is utilized to route signals from the output terminal of buffer 706(1) to first segment 735(1), and local routing structure 725(B)-2 is utilized to route signals from second wire segment 735(2) to the input terminal of buffer 706(1). In yet another example shown in FIG. 7(C), a "right-angle" connection is formed in which a local routing structure 725(C)-1 is utilized to route signals from first segment 735(1) to the input terminal of buffer 706(1), and local routing structure 725(C)-2 is utilized to route signals from the output terminal of buffer 706(1) to third wire segment 735(3). Accordingly, local routing structures are generated for each ASIC design to selectively route signals in either of two directions along the collinear optimal-length wire segments of the pre-engineered routing structure, or at right angles by connecting segments located in different metal layers. In one embodiment, polysilicon connections are utilized to make implement the local connection to the source wire segment, and low-level metal connections are utilized to make connections to the destination wire segment.

Figure 8:
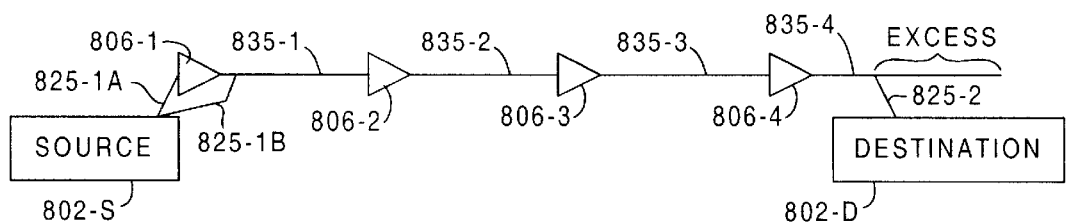
FIG. 8 is a simplified plan view showing connections between source and destination circuits using a pre-engineered routing structure according to another embodiment of the present invention.

FIG. 8 is a simplified plan view showing a portion of an ASIC in which a signal path is provided between a source circuit 802-S and a designation circuit 802-D by collinear wire segments 835-1 through 835-4 and buffers 806-1 through 806-4.

In accordance with another aspect of the present invention, signals are driven onto the signal paths using the buffers as driving sources, thereby reducing the requirements on the source circuit. For example, a first local connection 825-1A is provided between an output terminal of source circuit 802-S and buffer 806-1, thereby effectively incorporating buffer 806-1 into source circuit 802-S to drive signals onto wire segment 835-1. Selectively positioning source circuit 802-S is made possible because the lower level metal interconnect and transistor layers are customized for each ASIC design. Of course, in an alternative embodiment, source circuit 802-S may be provided with a distinct driver circuit, and a second local connection 825-A2 may be provided that routes the signal from source circuit 802-S directly onto wire segment 835-1.

In accordance with yet another aspect of the present invention, destination circuits can be connected by local wiring to the end of a last wire segment, or the signal can be "tapped off" of a wire segment, as shown in FIG. 8. Specifically, FIG. 8 shows destination circuit 802-D connected by local connection 825-2 to the center of wire segment 835-4, which is the last segment included in the signal path between source circuit 802-S and destination circuit 802-D. When signals are tapped in this manner, the excess portion of last wire segment 802-D that extends beyond the tap point (indicated in FIG. 8) can act as a load that makes signal transmission less than optimal. One approach to addressing this loading is to trim the excess (unused) portion of wire segment 835-4. However, this approach would require customized masks that would reduce the benefits provided by the pre-engineered routing structure.

Figure 9:
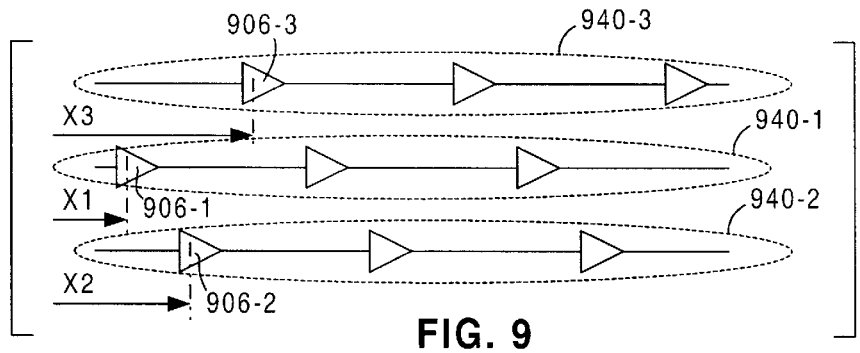
FIG. 9 is a simplified plan view showing a pre-engineered routing structure including staggered wire segments according to yet another embodiment of the present invention.

FIG. 9 illustrates another approach to addressing the loading caused by partially utilized wire segments. In this approach, the additional loading can be minimized by arranging parallel series of optimal-length wire segments that have staggered break points, thereby allowing the ASIC design software to select a series of collinear segments that minimize unused portions of the first and/or last segment. In particular, collinear wire segment series 940-1 is arranged such that buffer 906-1 is positioned at location X1, collinear wire segment series 940-2 is arranged such that buffer 906-2 is positioned at location X2, and collinear wire segment series 940-3 is arranged such that buffer 906-3 is positioned at location X3, where locations X1, X2, and X3 represent X-coordinate positions on an ASIC chip.

Figure 10:
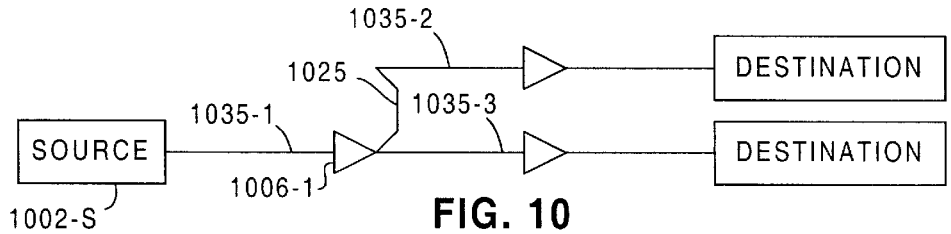
FIG. 10 is a simplified diagram showing signal fan-out connections using the pre-engineered routing structure according to yet another embodiment of the present invention.
Figure 11:
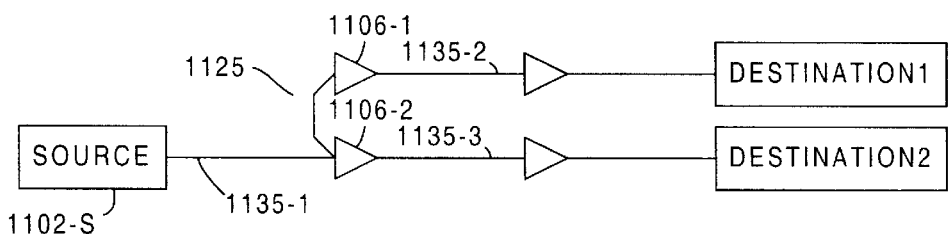
FIG. 11 is a simplified diagram showing signal fan-out connections using the pre-engineered routing structure according to yet another embodiment of the present invention.

FIGS. 10 and 11 illustrate alternative approaches to the case where a long-distance signal path branches to two destinations. FIG. 10 shows a first approach in which signal paths are only permitted to branch at the ends of the wire segments, and both downstream wire segments are driven by the same buffer. Specifically, source circuit 1002-S transmits a signal on wire segment 1035-1 to buffer 1006-1, whose output terminal is connected to a second wire segment 1035-2 by a local connection 1025 and to a third wire 1035-3. FIG. 11 shows a second approach in which both downstream wire segments are driven by separate buffers. Specifically, source circuit 1102-S transmits a signal on a wire segment 1135-1, which is connected by local connector 1125 to the input terminal of a buffer 1106-1, which transmits the signal onto a wire segment 1135-2. Wire segment 1135-1 also transmits the signal to the input terminal of buffer 1106-2, which drives the signal onto a wire segment 1135-3. Accordingly, both wire segment 1135-2 and wire segment 1135-3 are driven by separate buffers (buffers 1106-1 and 1106-2, respectively). In yet another embodiment (not shown), a restriction is implemented in the place and route tools that prohibits signal branching (i.e., each signal transmitted from a source to a destination must have its own signal path). This approach is very inefficient in area, particularly for high fan-out signals, but provides good wire delay estimation. In yet another embodiment, connections may tap off long-distance wire directly, though this slows signal transmissions on the wire segments.

Figure 12:
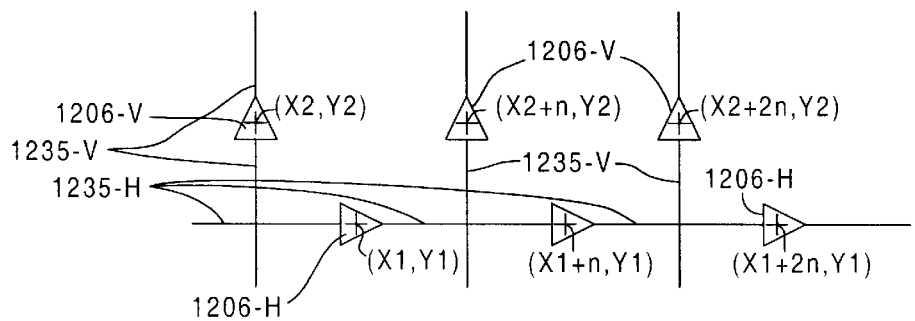
FIG. 12 is a simplified plan view showing a pre-engineered routing structure including offset wire segments according to yet another embodiment of the present invention.

FIG. 12 is a simplified plan view showing a pre-engineered routing structure including horizontal wire segments 1235-H connected by buffers 1206-H, and vertical wire segments 1235-V connected by buffers 1206-V. In accordance with another aspect of the present invention, horizontal wire segments 1235-H and vertical wire segments 1235-V are arranged such that the location of wire breaks (and, hence, the location of buffers 1206-H and 1206-V) are offset relative to the ASIC chip surface. For example, as shown in FIG. 12, horizontal wire segments 1206-H are positioned such that buffers 1206-H are located at positions (X1+n, Y1), where X1 and Y1 are coordinate locations on the ASIC chip surface, and n represents the distance between each segment break. In contrast, vertical wire segments 1206-V are positioned such that buffers 1206-V are located at positions (X2+n, Y2), where X2 and Y2 are coordinate locations on the ASIC chip surface that differ from locations X1 and Y1. Offsetting the breaks in horizontal wire segments 1235-H and vertical wire segments 1235-V in this manner prevents interference between buffers 1206-H and 1206-V.

Although the present invention has been described with respect to certain specific embodiments, it will be clear to those skilled in the art that the inventive features of the present invention are applicable to other embodiments as well, all of which are intended to fall within the scope of the present invention. For example, the ASIC manufacturer may provide optional sets of masks that allow the collinear optimal length wire segments to be narrowly or widely spaced, thereby selectively reducing capacitance and increasing speed. In another example, the ASIC manufacture may choose to route power and ground using the same metal layers as those used for the collinear optimal length wire segments. Since power supply signals do not switch, this technique removes the uncertainty of delay due to crosstalk with other switching signals. In yet another alternative embodiment, instead of generating local interconnections to the pre-engineered routing structures during the place-and-route process, the long-distance routing structure may be modified to include a multiplexer controlled by a memory cell at the input terminal of each interlinking buffer, thereby making segment-to-segment connections field-programmable with minimal increase in delay. In yet another embodiment, since the actual optimal length depends on the loading (i.e., the number of signal lines tapped into a particular wire segment) on the wire, sets of dedicated wires of different lengths may be provided to allow the use of shorter wire segments for branched signals, thereby allowing the load of the branched wire to be the same as that on optimal length wires. Further, ends of wire segments that are not connected to buffers or source/destination circuits may be connected to pre-defined termination structures, which are typically formed by resistors connected to power and/or ground to prevent signal ringing. Alternatively, the buffer may be designed to avoid driving the signal on the wire at a speed that would cause ringing. Buffers that avoid ringing would be beneficial even if the wire segments were not optimal length (i.e., much longer than optimal length). Further, instead of a single wire carrying the signal, a bus may be used. Signals may be transmitted using differential signaling on pairs of wires. Finally, one or more re-usable masks for producing patterns of shorter wire segments may be included in metal layers located below the optimal length wire segments to facilitate short-distance signal transmissions. All of these alternative embodiments are intended to fall within the scope of the present invention.

What is claimed is:

1. A method for making a large-scare Application-Specific Integrated Circuit (ASIC) using a selected ASIC family such that the ASIC implements a selected logic design, the method comprising:

pre-engineering a routing structure for the ASIC family that includes sets of optimal-length collinear interconnect wire segments and optimal-size interlinking buffers that minimize signal delays associated with long distance signal transmissions;

storing the logic design in the memory of a computer, the computer also storing a design library including the pre-engineered routing structure; and placing and routing the logic design such that long distance signal transmissions of the logic design are routed using the pre-engineered routing structure.

2. The method according to claim 1, wherein pre-engineering comprises calculating an optimal length of each interconnect wiring segment by simulating wire segments of various lengths using distributed resistance and capacitance wire models, and estimating crosstalk from neighboring wires.

3. The method according to claim 2, wherein pre-engineering further comprises calculating an optimal size of each buffer by determining a buffer size that optimizes the speed of signal transmissions on each optimal-length wire segment.

4. The method according to claim 1, wherein placing and routing further comprises comparing each signal transmission with a predetermined signal distance, wherein the long distance signal transmissions are greater than the predetermined signal distance.

5. The method according to claim 1, wherein placing and routing further comprises routing short distance signal transmissions using custom routing structures, wherein the short distance signal transmissions are shorter than the long distance signal transmissions.

6. The method according to claim 1, wherein placing and routing further comprises calculating a signal delay for each long distance signal transmission, and re-placing a source of the long distance signal transmission when the calculated delay is greater than a predefined maximum delay.

7. The method according to claim 1, further comprising fabricating the ASIC on a semiconductor substrate using a plurality of metal layers, wherein, during placing and routing, one or more metal layers are reserved for fabricating the optimal-length collinear interconnect wire segments.

8. The method according to claim 7, wherein a first metal layer is reserved for a first set of interconnect wire segments extending in a first direction, and a second metal layer is reserved for a second set of interconnect wire segments extending in a second direction that is perpendicular to the first direction.

9. The method according to claim 7, wherein, during placing and routing, a first metal layer is reserved for the optimal-length collinear interconnect wire segments, and one or more secondary metal layers are utilized to implement short distance signal transmissions, and wherein the one or more secondary metal layers are located between the semiconductor substrate and the first metal layer.

10. The method according to claim 1, further comprising fabricating the ASIC on a semiconductor substrate using a plurality of masks, wherein, during placing and routing, one or more regions on the semiconductor substrate are reserved for fabricating the optimal-size interlinking buffers.

11. The method according to claim 10, wherein placing and routing comprises providing a first local connection between a first wire segment and an input terminal of a buffer, and providing a second local connection between an output terminal of the buffer and a second wire segment.

12. The method according to claim 11, wherein the buffer is oriented such that the output terminal and the input terminal define a line that is perpendicular to the first and second wire segments.

13. The method according to claim 11, wherein the buffer first local connection comprises polysilicon, and the second connection comprises metal.

14. The method according to claim 1, wherein placing and routing comprises placing a first logic portion adjacent to a first buffer of the pre-engineered routing structure such that a signal generated by the first logic portion is driven onto a first wire segment by the first buffer.

15. The method according to claim 14, wherein placing and routing further comprises providing a local connector between an output terminal of the first logic portion and an input terminal of the first buffer.

16. The method according to claim 1, wherein pre-engineering comprises staggering break points of the optimal-length collinear interconnect wire segments.

17. The method according to claim 1, wherein placing and routing comprises routing a branched signal path such that a signal generated by a buffer of the pre-engineered routing structure is transmitted via a local connector to a first wire segment, and is transmitted onto a second wire segment.

18. The method according to claim 1, wherein placing and routing comprises routing a branched signal path such that a signal transmitted on a first wire segment of the pre-engineered routing structure is transmitted via a local connector to an input terminal of a first buffer, and is transmitted to an input terminal of a second buffer.

19. The method according to claim 1, wherein breaks in a first set of wire segments extending in a first direction are offset from breaks in a second set of wire segments extending in a second direction such that the optimal-sized interconnect buffers associated with the first set are located away from the optimal-sized interconnect buffers associated with the second set.

20. The method according to claim 1, wherein placing and routing further comprises placing and routing a destination circuit such that the destination circuit taps off of a selected optimal-length interconnect wire segment, and trimming an unused portion of the selected optimal-length interconnect wire segment.

21. A large-scale Application-Specific Integrated Circuit (ASIC) of a selected ASIC family that is processed to implement a selected logic design, the ASIC comprising:

a plurality of pre-defined transistors;

a plurality of custom-designed connection structures connected to selected pre-defined transistors; and a pre-engineered routing structure formed over the plurality of custom-designed connection structures that includes sets of optimal-length collinear interconnect wire segments and optimal-size interlinking buffers that minimize signal delays associated with long distance signal transmissions, wherein at least some of the pre-engineered routing structures are connected by corresponding custom-designed connection structures such that long distance signal transmissions of the selected logic design are routed using said at least some of the pre-engineered routing structure.

22. The large-scale ASIC of claim 21, wherein at least some of the pre-engineered routing structures are isolated from said plurality of custom-designed connection structures.

23. A method for making a design library for a family of Application-Specific Integrated Circuits (ASICs) that is used to place and route metal signal connections during the production of an ASIC implementing a selected logic design, the method comprising:

determining an optimal-length Wire segment for the ASIC family by simulating wire segments of various lengths using distributed resistance and capacitance wire models, and estimating crosstalk from neighboring wires; and reserving space on one or more metal layers associated with the family of ASICs for said optimal-length interconnect wire segment.

24. The method according to claim 23, further comprising:

determining an optimal buffer size that optimizes the speed of signal transmission on each optimal-length wire segment; and reserving space on a substrate associated with the family of ASICs for the optimally-sized buffers.

* * * * *